United States Patent [19]
Anderson

[11] Patent Number: 6,166,917
[45] Date of Patent: Dec. 26, 2000

[54] TECHNIQUES OF ASSEMBLING MODULAR ELECTRONIC EQUIPMENT

[75] Inventor: Scott Anderson, N. Grafton, Mass.

[73] Assignee: 3Com Corporation, Santa Clara, Calif.

[21] Appl. No.: 09/003,627

[22] Filed: Jan. 7, 1998

[51] Int. Cl.⁷ .................................................. H05K 5/00
[52] U.S. Cl. ......................... 361/756; 361/752; 361/759; 361/802
[58] Field of Search .......................... 361/756, 726–727, 361/684–686, 759, 752, 737, 740, 741, 802

[56] References Cited

U.S. PATENT DOCUMENTS

| | | | |
|---|---|---|---|
| 3,723,823 | 3/1973 | Lit et al. ............................... | 211/41.17 |
| 3,736,472 | 5/1973 | Muldoon, Jr. ............................ | 361/802 |
| 3,878,438 | 4/1975 | Weisman ................................. | 361/802 |
| 3,899,721 | 8/1975 | Borchard et al. ........................ | 361/802 |
| 4,534,472 | 8/1985 | Hanseler et al. ....................... | 211/41.17 |
| 4,924,354 | 5/1990 | Hermanutz et al. ..................... | 361/801 |
| 5,406,455 | 4/1995 | Devenish, III . | |
| 5,467,254 | 11/1995 | Brusati et al. .......................... | 361/799 |
| 5,530,624 | 6/1996 | Noon . | |
| 5,533,631 | 7/1996 | Marchetti . | |
| 5,555,158 | 9/1996 | Dent . | |
| 5,642,264 | 6/1997 | Cantrell . | |
| 5,657,204 | 8/1997 | Hunt . | |
| 5,661,640 | 8/1997 | Mills et al. ............................. | 361/801 |
| 5,680,296 | 10/1997 | Hileman et al. . | |
| 5,738,226 | 4/1998 | Dean .................................... | 211/41.17 |
| 5,805,429 | 9/1998 | Anderson ............................... | 361/799 |

OTHER PUBLICATIONS

Bivar, 1995/96 Thirtieth Anniversary Catalog, pp. 10 and 16, 1995.

*Primary Examiner*—Jeffrey Gaffin
*Assistant Examiner*—Tuan Dinh
*Attorney, Agent, or Firm*—Michaelson & Wallace; Peter L. Michaelson

[57] ABSTRACT

A technique for installing circuit cards on a motherboard in an electronic device. A motherboard, having a plurality of keyhole apertures and locking apertures, mounts in the electronic device. Cardguide pairs mount on the motherboard to form expansion ports for receiving circuit cards. Each cardguide pair has two parallel card guides. Each card guide has an elongated body with a bottom member and a longitudinal groove. Entrance ports and ramps located at either end of the body communicate with the groove. Mushroom mounting lugs and resilient locking hooks mount on the bottom member. A cardguide installer places each card guide on the motherboard while passing each mushroom lug into a wide segment of a keyhole aperture. The installer then slides the card guides parallel to the plane of the motherboard to move the mushroom lugs into a narrow segment of the keyhole apertures, while the hooks couple to the locking apertures.

23 Claims, 4 Drawing Sheets

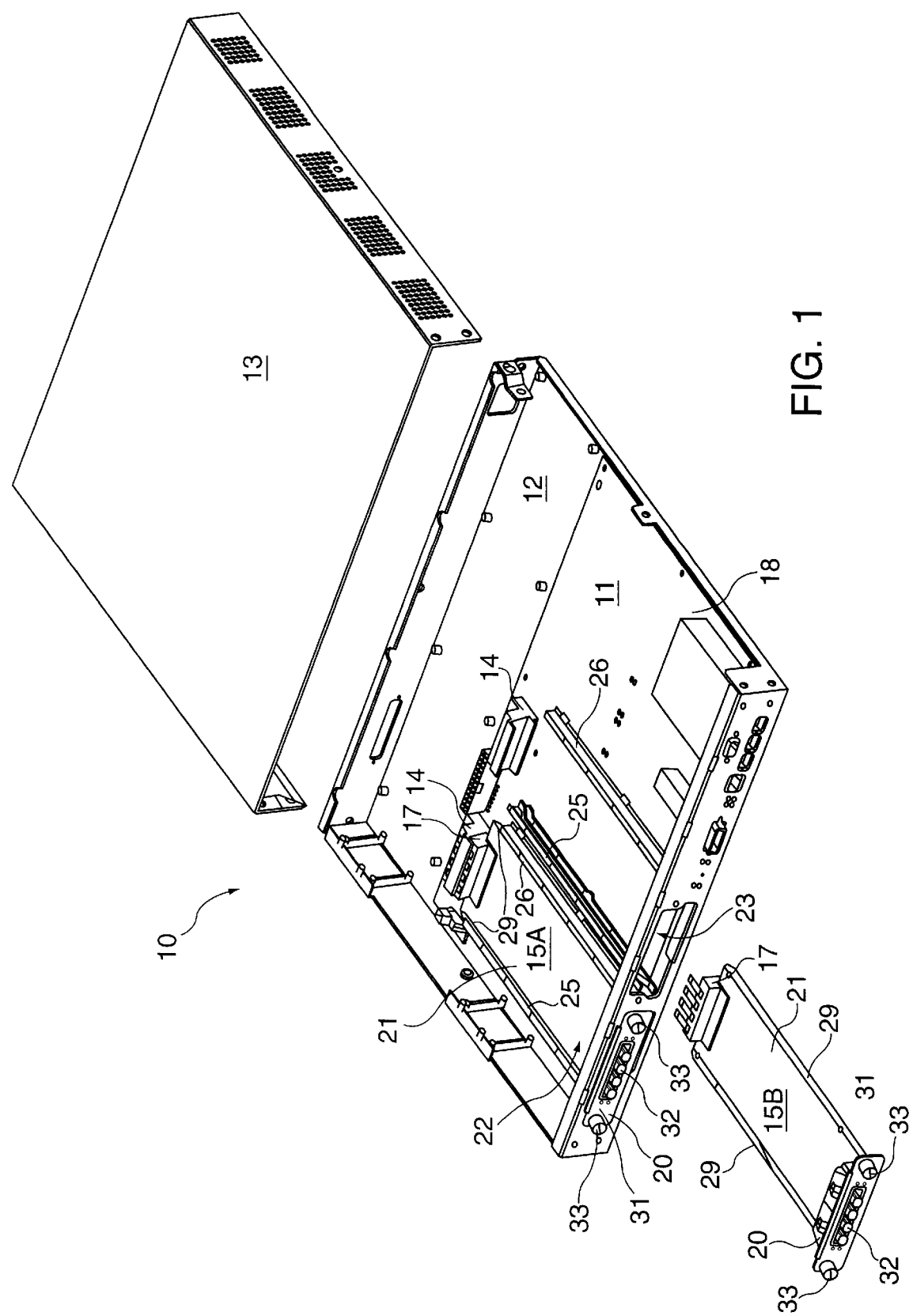

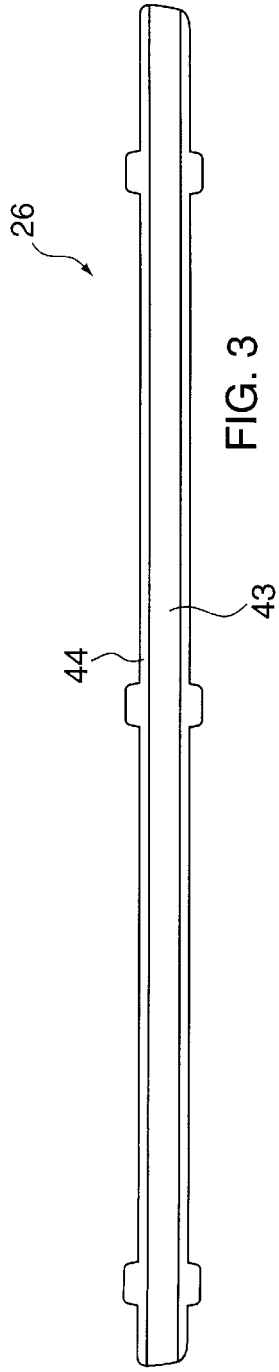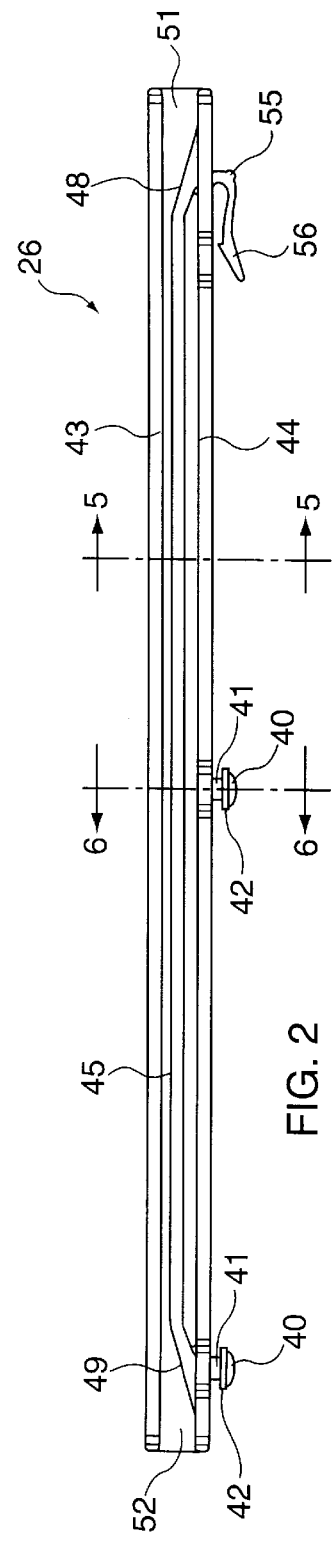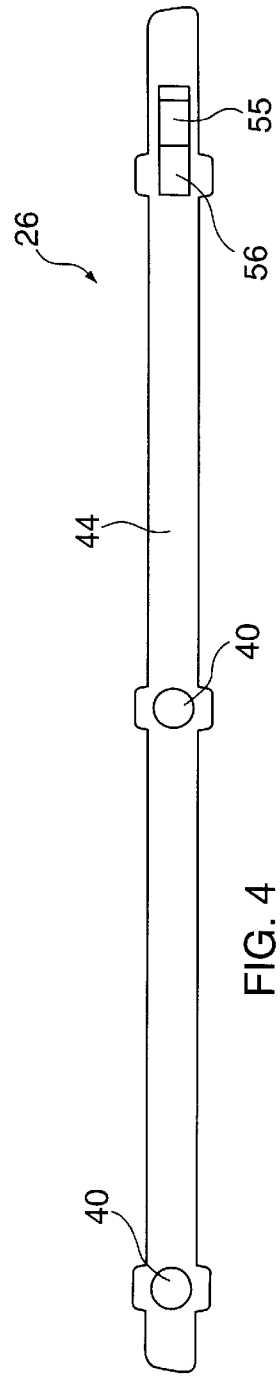

TECHNIQUES OF ASSEMBLING MODULAR ELECTRONIC EQUIPMENT

BACKGROUND OF THE INVENTION

1. Field of the Invention

The present invention relates generally to techniques of assembling modular electronic equipment. More particularly, it relates to methods and apparatus for selectively mounting and securing card guides within electronic equipment.

2. Description of the Prior Art

Modular construction techniques are widely used to manufacture a variety of electronic equipment. For example, manufactures of computer equipment use modular construction techniques extensively. With modular techniques, a manufacturer can economically and expeditiously assemble several variations of an electronic device using different combinations of preassembled modular circuits. Additionally, vendors may routinely assemble electronic systems from basic units at a point of sale. Further, end users are usually capable of reconfiguring and/or upgrading modular electronic systems with little effort. In most instances, replacing and/or adding modular electronic circuits in a system requires no more than a simple screwdriver and minimal mechanical skill.

For instance, a conventional personal computer (PC) system generally comprises arrays of prefabricated electronic components mounted on printed circuit boards (PCBs), to form combinations of PCB assemblies. PC manufacturers typically mount a variety of PCB assemblies on a common chassis, along with other components, to form a basic but often incomplete version of a final PC system. Then, in response to a customer request for a particular model having specific capabilities, a manufacturer or vendor adds one or more PCB assemblies and other components to the basic version to produce the appropriate configuration for the model requested. Later, the customer may wish to personally augment the capabilities of or upgrade the PC system. In that case, the manufacturer could provide the customer with the appropriate option cards, which the customer would self-install.

More specifically, a PC, a peripheral device or other modular system usually contains a main circuit board assembly, called a motherboard, which typically comprises a relatively large PCB on which many of the device's main components mount. The motherboard normally mounts on a chassis, which often forms a part of an outer casing that encloses the system components. In addition, a basic system usually includes other components that mount on the chassis and connect to the motherboard. Finally, unused card connectors and supports, which are equipped to accept certain option cards to be installed at some future time, are also located in a basic system. These unused connectors and supports are ordinarily associated with special card guides that help installers insert option cards quickly and accurately in their proper locations within the system.

Manufacturers normally mount card guides on strong, rigid members, such as the walls of a sheetmetal chassis. One common card guide has a plastic body and resilient mounting lugs with barbs that protrude from the bottom surface of the body. When installing these card guides, an installer begins by drilling appropriate mounting holes at suitable locations on a rigid structure. Next, the installer aligns the card guide so that the mounting lugs mate with the drilled holes. Finally, the installer presses on the card guide or strikes the guide with a hammer or other tool until the lugs snap into the holes.

To enhance the physical construction of some modular equipment and further simplify the instillation of option cards, it has been suggested that some option cards be piggybacked on a motherboard. Consequently, efforts are underway to develop techniques for mounting card guides directly on a fully populated motherboard. Although prior art techniques for mounting card guides have served their intended purpose, they have proved to be unreliable when used to install card guides on the relatively thin, flexible and delicate structure of an ordinary motherboard. Thus, manufacturers have rejected proposals to use the conventional card guides and the installation techniques described above. Manufacturers have found that the insertion forces exerted on a motherboard, as a result of snapping the barbed mounting lugs into their mounting holes, frequently flex and damage etched conductors and other components located on an ordinary motherboard.

SUMMARY OF THE INVENTION

The present invention solves this problem in the art by providing reliable techniques for installing card guides directly on a populated circuit board. One aspect of the present invention includes a card guide having an elongated body with a top member, a bottom member and a longitudinal open groove. An entrance port, located at one end of the body, communicates with the groove. At least one mounting lug is fixed to the bottom member while a guide fastener projects from the body. The mounting lug and the guide fastener enable the card guide to be fixed to a populated circuit board while retaining the structural and functional integrity of the circuit board.

Another aspect of the invention involves an apparatus for holding circuit cards in an electronic device. The apparatus includes a circuit board having a plurality of mounting holes. At least one cardguide pair mounts on the circuit board. Each cardguide pair has first and second parallel card guides with each card guide having an elongated body with a top member, a bottom member and a longitudinal open groove. An entrance port, located at one end of the body, communicates with the groove. At least one mounting lug is fixed to the bottom member and mates with a mounting hole. A guide fastener projects from the body and couples to a locking hole in the circuit board.

Still, another aspect of the invention includes a method of installing a card guide on a circuit board. The method includes the following steps: forming the card guide with an elongated body having at least one mounting lug projecting from the body and a guide fastener fixed to the body; forming at least one mounting hole in the circuit board with each mounting hole having a first hole segment and a second hole segment, the first hole segment being larger than said second hole segment and the mounting lug; forming at least one locking hole in the circuit board; placing each card guide on the circuit board while passing the mounting lug into the first hole segment; and moving each card guide with respect to the circuit board in a direction parallel to the plane of the circuit board to move the mounting lug from the first hole segment to the second hole segment, and to mate the guide fastener with the locking hole.

BRIEF DESCRIPTION OF THE DRAWINGS

The teachings of the present invention can be readily understood by considering the following detailed description in conjunction with the accompanying drawings, in which:

FIG. 1 is an exploded pictorial view of a modular electronic device showing an installed option card piggybacked on a motherboard in accordance with the present invention;

FIG. 2 is a side elevation of a righthand card guide in accordance with the present invention;

FIG. 3 is a top view of the righthand card guide illustrated in FIG. 2;

FIG. 4 is a bottom view of the righthand card guide illustrated in FIG. 2;

DETAILED DESCRIPTION OF THE PREFERRED EMBODIMENT

Figure 5:
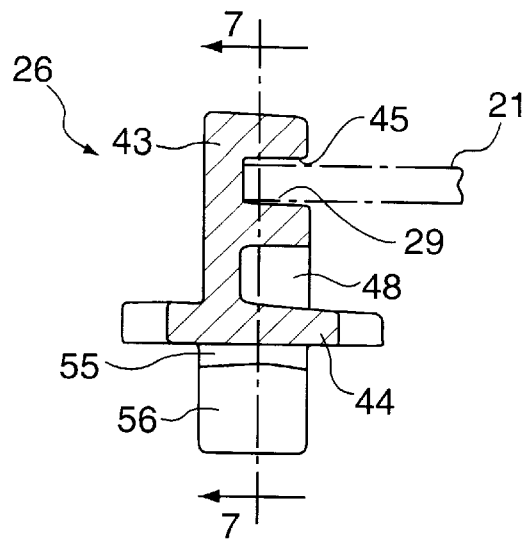
FIG. 5 is an enlarged cross section taken on the line 55 of FIG. 2 and looking in the direction of the arrows.
Figure 6:
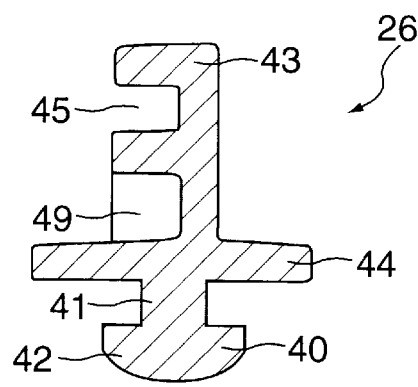
FIG. 6 is an enlarged cross section taken on the line 66 of FIG. 2 and looking in the direction of the arrows.
Figure 7:
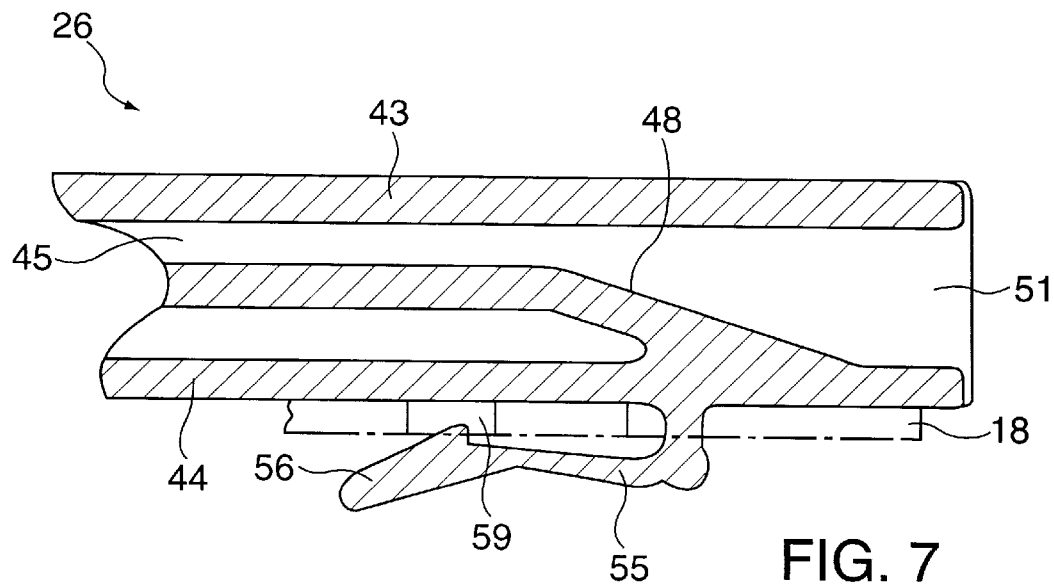
FIG. 7 is a cross section, with parts broken away, taken on the line 77 of FIG. 5 and looking in the direction of the arrows.

Referring now to the drawings, FIG. 1 depicts modular electronic device 10, which may be a PC, a peripheral device (e.g., a modem), or other modular electronic system. Device 10 includes motherboard 11, chassis 12, cover 13 and similarly shaped circuit cards 15A and 15B. Motherboard 11 comprises PCB 18, on which card connectors 14 and other components are mounted. The walls of chassis 12 have several openings for containing a variety of conventional components, such as cable connectors, switches, display lights, option cards, etc. Solid plates (not shown) normally cover any unused openings in chassis 12. For simplicity, FIG. 1 shows only a limited number of components on motherboard 11. However, like most finished PCB assemblies, motherboard 11 would normally contain a plethora of etched conductors and other components. Furthermore, reference characters appear in FIG. 1 for only significant components and structures of electronic device 10, while other structures are simply shown and not described.

Electronic device 10 further includes expansion slots 22 and 23, which are accessed through openings in the front wall of chassis 12. Each of the expansion slots 22 and 23 contains a cardguide pair mounted on PCB 18 in alignment with a corresponding connector 14 and an opening in the front wall of chassis 12. Each cardguide pair includes two parallel card guides, namely, lefthand card guide 25 and matching righthand card guide 26. Card guides 25 and 26 are preferably molded from plastic or other electrically nonconductive material. FIGS. 2–7 and 9 and the corresponding description below disclose the structural details of card guides 25 and 26.

FIG. 1 further shows circuit cards 15A and 15B each comprising a generally rectangular PCB assembly 21. Card connectors 17 are located on an edge of PCB assemblies 21. An opposite edge of each PCB assembly 21 holds an interface device 20 for communicating with a conventional external device (not shown) in a known manner. Interface device 20 comprises faceplate 31, connector 32 and a pair of panel fasteners 33. In addition, each PCB assembly 21 has parallel mounting edges 29 that are sized to mate with card guides 25 and 26 in a manner to be described below in detail. Circuit cards 15A and 15B represent examples of common option cards found in many conventional electronic systems. Thus, the usual conductors and other components that populate a PCB of a conventional option card have been omitted here for clarity.

Two openings in the front wall of chassis 12 (only one opening is visible in FIG. 1) function as access ports for expansion slots 22 and 23. The two openings of expansion slots 22 and 23 enable a user to install circuit cards 15A and 15B without having to remove cover 13 from chassis 12. Illustratively, FIG. 1 shows circuit card 15A fully installed in expansion slot 22, while circuit card 15B is shown spaced from and in alignment with the opening of expansion slot 23. When a user wishes to install a particular option card, say circuit card 15B, in an unused expansion slot, say expansion slot 23, the user first removes any blank plate that may be covering the chassis opening for slot 23. Next, the user inserts card 15B into slot 23 with connector 17 inserted first, as illustrated in FIG. 1. The user gradually slides card 15B into expansion slot 23 until faceplate 31 contacts the front wall of chassis 12. Connector 17 will automatically mate with its corresponding card connector 14 as the user slides card 15B into slot 23. Finally, the user threads panel fasteners 33 into chassis 12 to secure circuit card 15B within expansion slot 23.

It is a goal of the present invention to provide suitable mounting techniques for installing card guides 25 and 26 onto a populated PCB assembly, such as motherboard 11, without damaging any circuit components and/or etchings located thereon. Ideally, a card installer should be capable of manually mounting card guides 25 and 26 on a fully populated motherboard 11 with only moderate effort and no special tools. In addition, the installation procedure should be such that the structural and functional integrity of motherboard 11 is not jeopardized. To accomplish this goal, mounting structures are provided that permit guides 25 and 26 to be installed manually, without the use of tools and with no forces being directed transverse to the plane of PCB 18.

Figure 8:
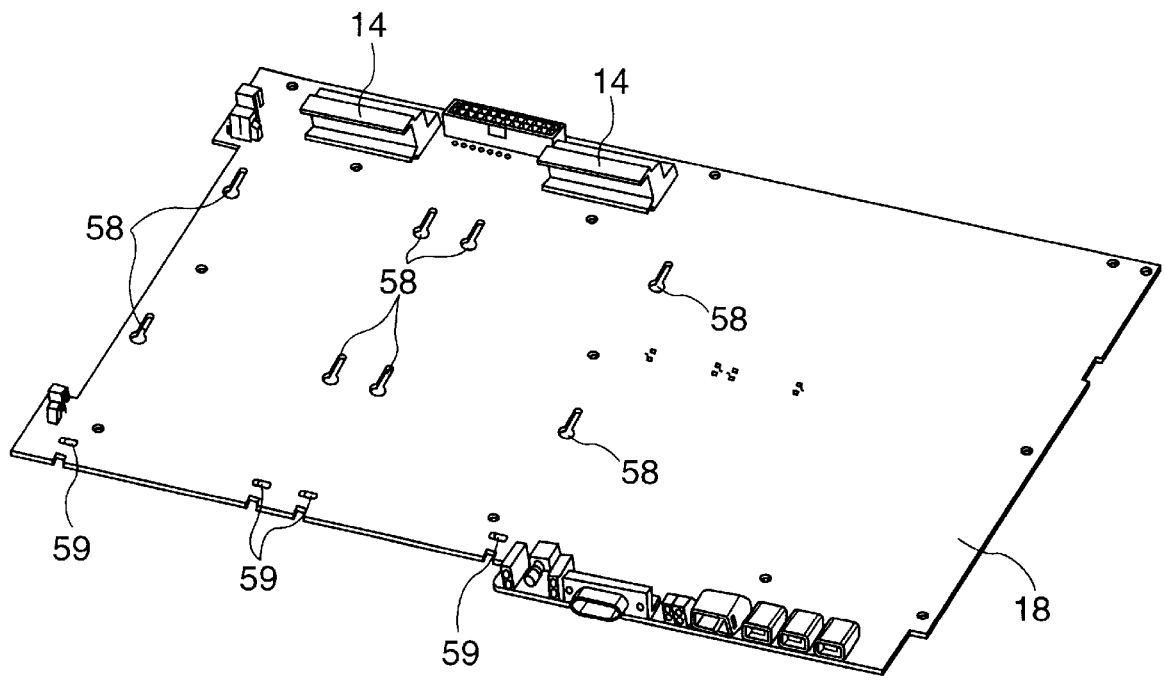
FIG. 8 is a pictorial view of a PCB in accordance with the present invention.
Figure 9:
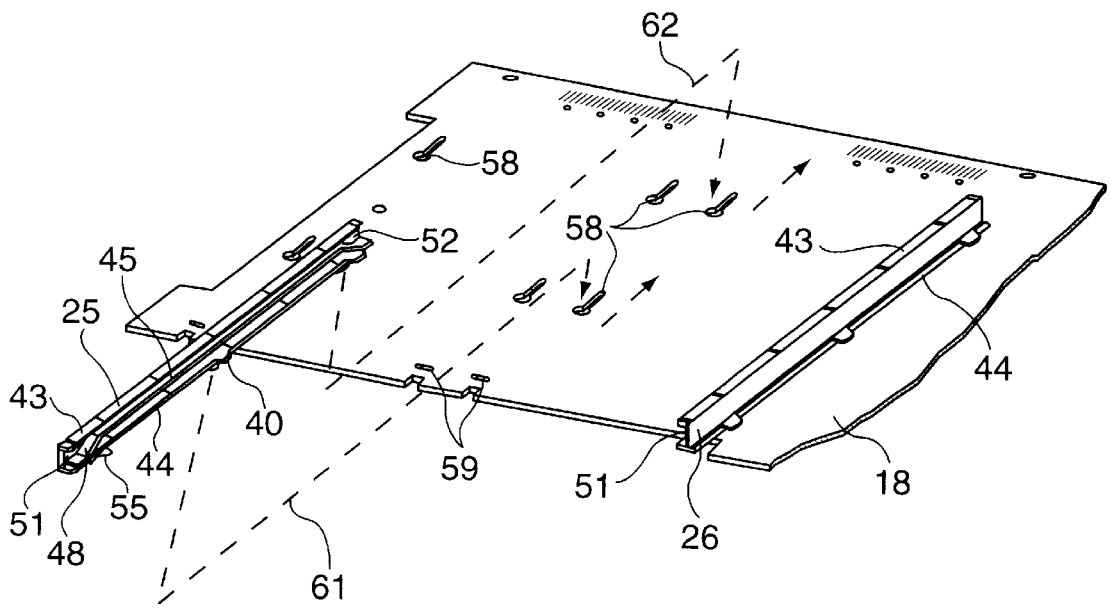
FIG. 9 is an exploded pictorial view, with parts broken away, illustrating the installation of a card guide pair on a PCB in accordance with the present invention.

More specifically, FIGS. 2–7 and 9 depict the structural details of card guides 25 and 26, while FIGS. 8 and 9 show details of PCB 18. As best seen in FIGS. 1, 2 and 9, lefthand card guide 25 and righthand card guide 26 are mirror images of each other. Thus, FIGS. 2–7 illustrate only the details of righthand card guide 26. Similar details with respect to card guide 25 are shown in FIG. 9.

As best seen in FIGS. 2–7, card guide 26 comprises top member 43, bottom member 44 and longitudinal groove 45. Groove 45 has a height that is greater than that of edge 29 on PCB 21, as depicted with phantom lines in FIG. 5. A pair of spaced, mushroom lugs 40 extends from bottom member 44. Lugs 40 include a relatively narrow neck 41 on which a larger head 42 mounts. At the front of card guide 26, ramp 48 extends from one end of groove 45 to front entrance port 51. At the rear of card guide 26, ramp 49 extends from a second end of groove 45 to rear entrance port 52. Hook 55 mounts on card guide 26 just below ramp 48. Specifically, hook 55, which has a barb 56, resiliently attaches to the bottom surface of card guide 26. As mentioned above, card guides 25 and 26 are mirror images of each other; the essential difference between guides 25 and 26 is that their grooves 45 open in opposite directions. Specifically, groove 45 in righthand card guide 26 opens to the left while groove 45 in lefthand cardguide 25 opens to the right.

With reference to FIGS. 8 and 9, PCB 18 comprises a number of apertures that operate with mushroom lugs 40 and hook 55 to fix card guides 25 and 26 on motherboard 11. Specifically, PCB 18 includes aligned keyhole apertures 58, which receive mushroom lugs 40, as best seen in FIG. 9. Keyhole apertures 58 each include a relatively large section and a narrower section. The diameter of the large section is greater than the diameter of head 42 on lug 40. The width of the narrower section of aperture 58 is less than the diameter of head 42 and greater than the thickness of neck 41. In addition, a front edge of PCB 18 includes a set of locking apertures 59. Each locking aperture 59 is sized to mate with barb 56 on hook 55.

Thus, when installing one of the card guides 25 or 26 on PCB 18, the installer simply passes heads 42 on lugs 40 through the large sections of keyhole apertures 58. That action, which FIG. 9 illustrates with dashed lines 61 and 62, positions the card guide being installed with its bottom member 44 resting on PCB 18 and its hook 55 hanging over the front edge of PCB 18. The installer then slides the relevant card guide towards the rear until its hook 55 snaps into locking aperture 59. At this point, necks 41 on mushroom lugs 40 will reside in the narrower sections of keyhole apertures 58, while heads 42 and bottom member 44 sit on opposite sides of PCB 18. In addition, barb 56 will project into locking aperture 59. Thus, mushroom lugs 40, hook 51, and apertures 58 and 59 essentially operate to anchor card guides 25 and 26 on PCB 18.

As such, the installation of card guides 25 and 26 may be reliably performed on a fully populated PCB assembly, such as a finished motherboard 11, without damaging delicate conductive etchings or other circuit components. The only significant installation force required, when installing card guides 25 and 26, is the force required to couple hook 55 with locking aperture 59. The magnitude of that force, which is primarily a function of the flexibility of hook 51, would normally be quite small. In addition, the direction of that insertion force would lie substantially in the plane of PCB 18. Since card guides 25 and 26 are installed in a motion that is parallel to the surface of PCB 18, any installation forces transmitted to PCB 18 will be in line with the "strong" direction of PCB 18. This will result in only negligible flexure of PCB 18 during cardguide installation. Consequently, a guide installer may manually affix guides 25 and 26 with only moderate hand pressure, thereby eliminating the need for a hammer or other tool as is normally required when installing conventional card guides.

Various modifications of the invention are contemplated. For example, since card guides 25 and 26 contain entrance ports, viz., ports 51 and 52, at either end thereof, circuit cards may be inserted into grooves 45 from either the front or rear ends of guides 25 and 26. It is also contemplated that card guides 25 and 26 may be constructed with two, back-to-back grooves rather than the single groove, i.e., groove 57, as depicted in the drawings. With a two-groove configuration, card guides could be used as righthand or lefthand guides. Additionally, a single card guide with two grooves may be shared by adjacent expansion ports. Of course, various other modifications and variations are contemplated and may obviously be resorted to in light of the present disclosure. It is to be understood, therefore, that within the scope of the appended claims, the invention may be practiced otherwise than as specifically described.

What is claimed is:

1. A card guide for mounting circuit cards on a planar printed circuit board in an electronic device, said card guide comprising:
   an elongated body having a top member, a bottom member, a longitudinal open groove and an entrance port at one end of said body in communication with said groove, said top member, said bottom member and said groove lying in parallel planes with the plane of said groove located between the plane of said top member and the plane of said bottom member;
   at least one mounting lug fixed to said bottom member and projected away from said plane of said bottom member, each said mounting lug having means for attaching said card guide to said printed circuit board with said plane of said groove parallel to said printed circuit board; and
   a guide fastener attached to said bottom member and projected away from said plane of said bottom member.

2. The card guide of claim 1 wherein said guide fastener includes a resilient hook having a free end with a barb spaced from said plane of said bottom member.

3. The card guide of claim 2 wherein each said lug comprises a neck and a head, said head having a cross section larger than the cross section of said neck, and wherein said neck mounts on said bottom member and said head mounts on said neck such that said head is spaced from said bottom member.

4. The card guide of claim 3 wherein said entrance port at said one end of said body has a height greater than the height of said groove.

5. The card guide of claim 4 further including a ramp in communication with said groove and said entrance port at said one end of said body.

6. The card guide of claim 5 where a plurality of said at least one mounting lug fixes to said bottom member.

7. The card guide of claim 6 wherein said hook mounts on said bottom member adjacent said one end of said body.

8. The card guide of claim 7 wherein said body has a second end, removed from said one end, said card guide further including a second entrance port located at said second end, and a second ramp communicating with said groove and said second entrance port, and wherein one of said mounting lugs fixes to said bottom member adjacent said second end and another of said mounting lugs fixes to said bottom member intermediate said one end and said second end.

9. Apparatus for mounting circuit cards on a printed circuit board in an electronic device, said apparatus comprising:
   a planar printed circuit board having a plurality of mounting holes located therein;
   at least one card-guide pair mounted on said planar printed circuit board, each said card-guide pair comprising first and second card guides, and each said first and second card guides comprising:
      an elongated body having a top member, a bottom member, a longitudinal open groove and an entrance port at one end of said body in communication with said groove, said printed circuit board, said top member, said bottom member and said groove lying in parallel planes with the plane of said groove located between the plane of said top member and the plane of said bottom member, and said bottom member located between said groove and said printed circuit board;
      at least one mounting lug fixed to said bottom member, each said mounting lug having means for mating with one of said mounting holes to attach said body of each said first and second card guides to said printed circuit board such that said grooves in said first and second card guides open toward each other and lie in a common plane parallel to the plane of said printed circuit board; and
      a guide fastener projecting from said body.

10. The apparatus of claim 9 wherein said mounting holes each comprise a first hole segment and a second hole segment, said first hole segment being larger than said second hole segment, and wherein each said mounting lug comprises a neck mounted on said bottom member and a head, wider than said neck, mounted on said neck such that said head is spaced from said bottom member, and wherein said neck is narrower than said second hole segment, and said head is narrower than said first hole segment and wider than said second hole segment.

11. The apparatus of claim 10 wherein said mounting holes mate with said mounting lugs such that a different one of said necks resides in each said second hole segment.

12. The apparatus of claim 11 further including a plurality of locking holes in said printed circuit board, each said guide fastener projecting from one of said bottom members away from said parallel planes, and each said guide fastener mating with a different one of said locking holes.

13. The apparatus of claim 12 wherein each said guide fastener includes a resilient hook having a barb residing in a corresponding one of said locking holes, and wherein each said card guide includes a ramp in communication with said groove and said entrance port thereon.

14. The apparatus of claim 13 wherein said electronic device comprises a vertical panel with at least one panel opening, said printed circuit board mounts in said electronic device with one of said card-guide pairs located adjacent said panel opening, and one of said circuit cards extends into said at least one panel opening and mates with said one of said card-guide pairs such that said printed circuit board and said circuit card lie in spaced planes parallel to each other.

15. Apparatus for holding circuit cards in an electronic device, said apparatus comprising:
  a circuit card;
  a printed circuit board having a plurality of mounting holes located therein;
  at least one card-guide pair attached to said circuit board, each said card-guide pair comprising first and second card guides, and each of said first and second card guides comprising:
    an elongated body having a card mounting means for receiving and holding said circuit card therein in spaced parallel relation to said printed circuit board;
    a guide mounting means fixed to said body for mating with said mounting holes; and
    a fastener means spaced from said guide mounting means for preventing movement between said card guide and said printed circuit board.

16. The apparatus of claim 15 wherein said mounting holes each comprise a first hole segment and a second hole segment, said first hole segment being larger than said second hole segment, and wherein each said guide mounting means comprises a neck mounted on said body and a head wider than said neck mounted on said neck such that said printed circuit board is located between said head and said body, and wherein said neck is narrower than said second hole segment and, said head is narrower than said first hole segment and wider than said second hole segment.

17. The apparatus of claim 16 wherein said card mounting means includes a longitudinal groove, port means for permitting a circuit card to be inserted into said groove at either of a plurality of locations, and means located at each of said plurality of locations for directing said circuit card into said groove.

18. The apparatus of claim 17 wherein said electronic device comprises a vertical panel with at least one panel opening, said printed circuit board mounts in said electronic device with one of said card-guide pairs located adjacent said panel opening, and one of said circuit cards extends into said at least one panel opening and mates with said one of said card-guide pairs such that said printed circuit board and said circuit card lie in spaced planes substantially parallel to each other.

19. A method of installing a card guide on a printed circuit board, whereby said card guide holds a circuit card on said printed circuit board, said method comprising:
  forming said card guide with an elongated body having at least one mounting lug projecting from said body and a guide fastener fixed to said body;
  forming at least one mounting hole in said circuit board, each said mounting hole formed with a first hole segment and a second hole segment, said first hole segment being larger than said second hole segment and said mounting lug;
  forming at least one locking hole in said circuit board;
  placing each said card guide on said circuit board, while passing said mounting lug into said first hole segment; and
  moving each said card guide parallel to the plane of said printed circuit board, and moving said mounting lug from said first hole segment to said second hole segment while mating said guide fastener with said locking hole.

20. The method of claim 19 wherein said forming said card guide step includes forming said at least one mounting lug with a neck fixed to said body and a head fixed to said neck with said neck being narrower than said head and said second hole segment, and said head being narrower than said first hole segment and wider than said second hole segment.

21. The method of claim 20 wherein said placing step includes passing said head through said first hole segment to place said neck in said first hole segment, and said moving step includes moving said neck into said second hole segment with said body and said head being located on opposite sides of said circuit board.

22. The method of claim 21 wherein said forming step includes forming said guide fastener with a resilient hook having a free end with a barb, and said moving step includes positioning said barb into said locking hole while said body moves parallel to said plane of said printed circuit board.

23. The method of claim 19 further including forming grooves in each said card guide, and sliding a planar circuit card into said grooves with the plane of said circuit card oriented parallel to said plane of said printed circuit board while said circuit card moves parallel to said printed circuit board.

* * * * *